United States Patent [19]
Makita et al.

[11] Patent Number: 6,165,264
[45] Date of Patent: *Dec. 26, 2000

[54] METHOD FOR SEMICONDUCTOR CRYSTAL GROWTH

[75] Inventors: Kikuo Makita; Akiko Gomyo, both of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/801,249

[22] Filed: Feb. 19, 1997

Related U.S. Application Data

[63] Continuation of application No. 08/362,177, Dec. 22, 1994, abandoned.

[30] Foreign Application Priority Data

Dec. 27, 1993 [JP] Japan ............................ 5-330428

[51] Int. Cl.⁷ ........................................... C30B 25/04
[52] U.S. Cl. ......................... 117/95; 438/249; 438/250; 438/267; 438/286; 438/293
[58] Field of Search ............... 437/89, 90, 107, 437/126, 133; 117/95; 438/249, 250, 267, 286, 293

[56] References Cited

U.S. PATENT DOCUMENTS

| 5,151,913 | 9/1992 | Ueno ................................. 372/46 |
| 5,166,945 | 11/1992 | Arimoto ............................. 372/46 |
| 5,250,462 | 10/1993 | Sasaki et al. ...................... 437/89 |
| 5,305,341 | 4/1994 | Nishikawa et al. ................. 372/45 |

FOREIGN PATENT DOCUMENTS 0114986   5/1989   Japan .

OTHER PUBLICATIONS

Selective Growth of InGaAs/InP Layers by Gas Source MBE With Atomic Hydrogen Irradiation, 1993, pp. 52–55.
Selective MOVPE Growth and its Applications to Optical Devices, 1993, pp. 44–47.
Sasaki et al. in "Electronics and Communications in Japan" Part 2, vol. 76(4), 1993, pp. 1–12, in "Selective MOVPE Growth and It's applications ——".
Takano et al. in "18 th European conference on Optics and Communication, at Berlin, Germany, 1992"pp. 177–180 in "1.55 milcron wavelength–tunable MOW ——".
Kato et al. in "18th European Conference on Optical Communication/Integrated Optics and Optical Fiber Communication, Paris, France, 1991, pp. 429–432".
Coudenys et al. in "4th International Conference on Indium Phosphide and Related Materials" Apr. 21–24, 1992, pp. 202–205 in "Lateral Bandgap Engineering ——".
Suzuki et al. in "Jr. of Crystal Growth, vol. 111, 1991, pp. 353–359" in "Reexamination of formation mechanism ——Natural Superlattices ——".
Norman et al. in "Semiconductor Science and Technology, vol. B(15), Jan. 1993, pp. S9–S15"in "Structural Studies of Natural Superlattices in group III–V alloy epitaxial layers".

(List continued on next page.)

*Primary Examiner*—Robert Kunemund

[57] ABSTRACT

The invention provides a method for selective growth of semiconductor crystals, including the step of forming a semiconductor layer in a selected region of a semiconductor substrate by using a mask, the semiconductor layer being controlled with respect to atomic ordering or natural super lattice (NSL). It is possible by the invention to control the energy gap, optical anisotropy and electrically conductive anisotropy of a semiconductor layer, and also possible by the invention to carry out two-dimensional control of material properties in a substrate in accordance with a pattern of a mask.

11 Claims, 3 Drawing Sheets

FIG. 2A

OTHER PUBLICATIONS

J. Finders, et al., "Composition of selectively grown $In_xGa_{1-x}As$ Structures from Locally Resolved Raman Spectroscopy", *Journal of Crystal Growth*, 107, Jan. 1, 1991, No. 1/4, Amsterdam. NL.

T. Sasaki, et al., "Selective MOVPE Growth and Its Applications to Optical Devices", *5th International Conference On Indium Phosphide and Related Materials*, Apr. 19–22, 1993, Paris, France, pp. 44–47.

Y. Chen, et al., "Masked growth of InGaAsP–based quantum wells for optoelectronic device applications", *Applied Physics Letters*, vol. 62, No. 14, Apr. 5, 1993, pp. 1641–1643.

T. Sasaki, et al., "Selective metalorganic vapor phase epitaxial growth of InGaAsP/InP Layers with Bandgap Energy Control in InGaAs/InGaAsP Multiple–Quantum Well Structures", *Journal of Crystal Growth*, vol. 132, No. 3/4, Sept. 1993, pp. 435–443.

T. Kato, et al., "Novel MQW DFB Laser Diode/Modulator Integrated Light Source Using Bandgap Energy Control Epitaxial Growth Techniques", *17th European Conference on Optical Communication ECOC '91*, Sep. 9–12, 1991, Paris, France, pp. 429–432.

*Patent Abstracts of Japan*, vol. 18, No. 8 (E–1486), Jan. 7, 1994, and JP 05 251345 A, Sep. 28, 1993.

FIG. 1 PRIOR ART
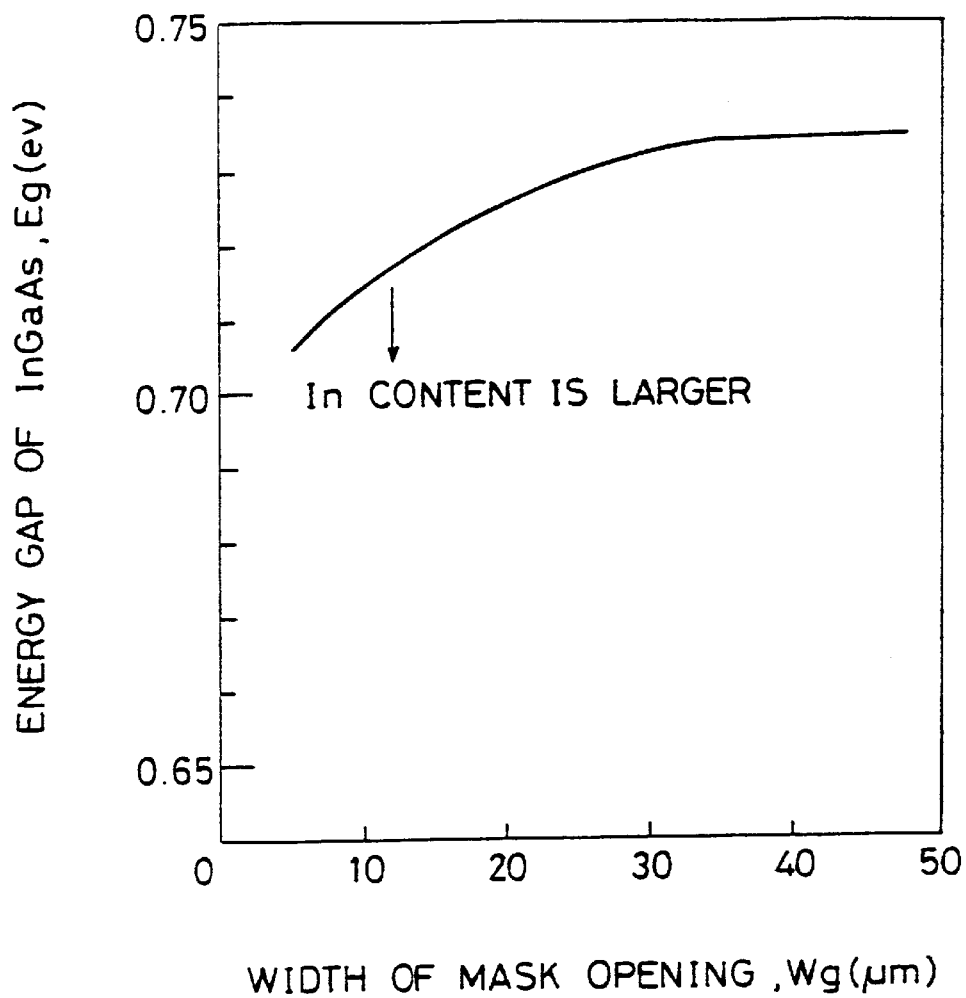
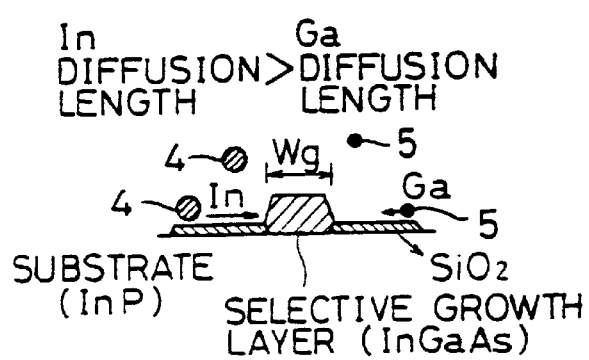
FIG. 1A
PRIOR ART

FIG. 3
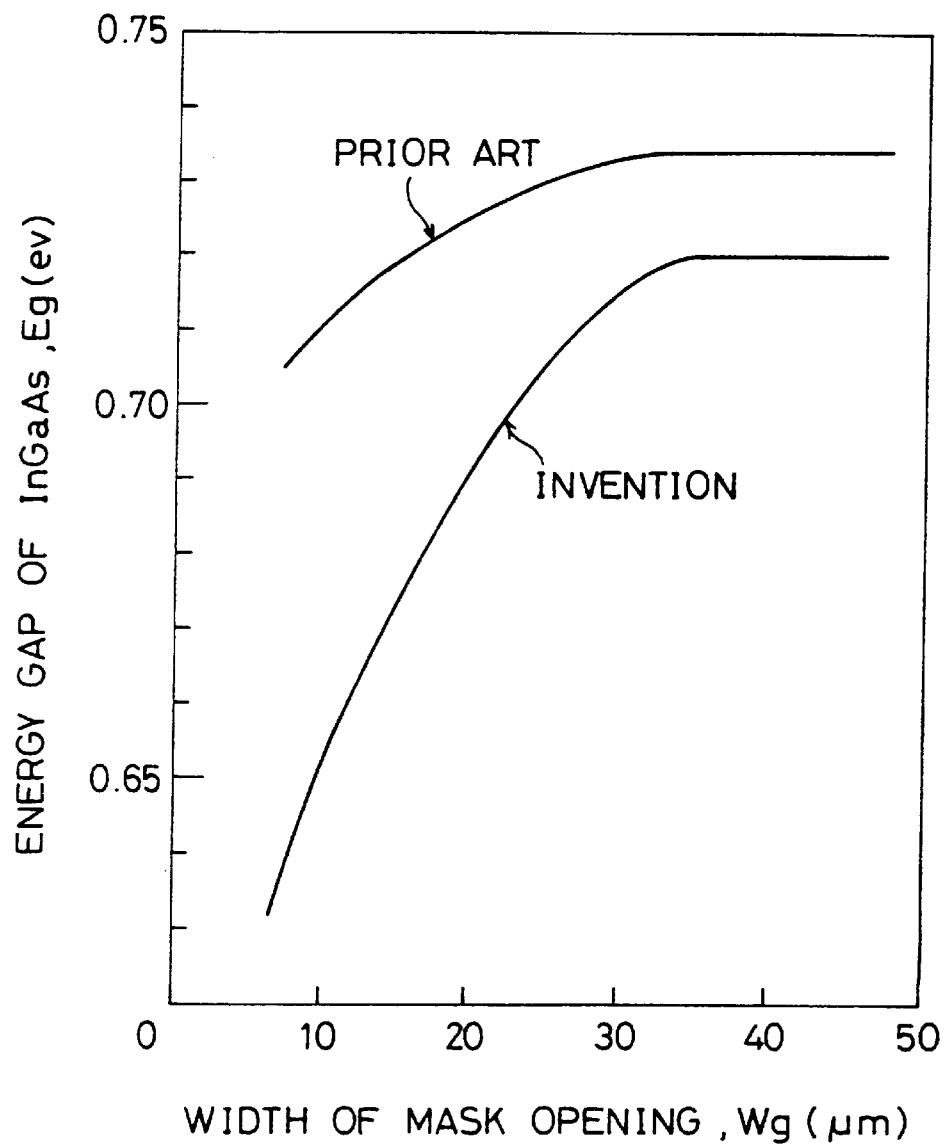
WIDTH OF MASK OPENING, Wg (μm)
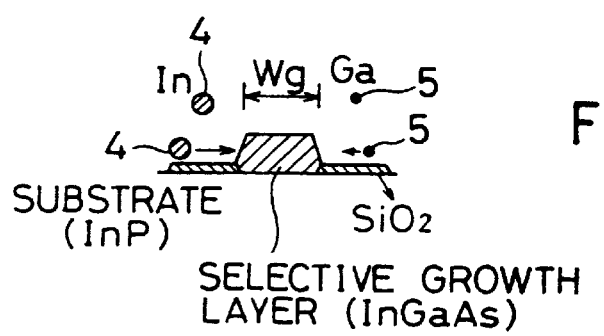
FIG. 3A

METHOD FOR SEMICONDUCTOR CRYSTAL GROWTH

This is a Continuation of application Ser. No. 08/362,177, filed on Dec. 22, 1994 now abandoned.

BACKGROUND OF THE INVENTION

1. Field of the Invention

The invention relates to a method for selectively growing semiconductor crystals, and more particularly to a method for selectively growing semiconductor crystals by which atomic ordering of a semiconductor layer or formation of natural super lattice (NSL) is controlled to thereby greatly change the material properties of a semiconductor layer such as energy gap, optical anisotropy and electrical conductivity, relative to prior methods.

2. Description of the Related Art

Many attempts have been made to form a striped pattern with $SiO_2$ or SiNx on a semiconductor substrate in the field of a chemical compound semiconductor including group III–V species, to thereby selectively grow a semiconductor layer on non-patterned regions by various methods such as MOVPE, MBE or VPE. For instance, there is reported one such attempt in the 5th International Conference on Indium Phosphide and related Materials, 1993, pages 44–47 and 52–55. In such a selective growth, it is possible to vary the composition of a semiconductor layer at selective growth regions in accordance with a difference of a degree of removal from and adsorption into a surface of atoms and molecules flying thereto, or a difference of a migration or a diffusion length of atoms and molecules flying thereto, which atoms and molecules contribute to the growth of a semiconductor layer. FIGS. 1 and 1A show the dependency on the width of a mask of the energy gap of an InGaAs semiconductor layer in the selective MOVPE growth. Indium (In) atoms have a longer diffusion length than gallium atoms, and hence the indium atoms have a higher arrival probability than the gallium atoms. In other words, the In atoms can arrive at a selective growth layer earlier than the Ga atoms. Accordingly, the narrower a mask width is, the higher dependency probability with which a selective growth region is dependent on In atoms the selective growth region has, and thereby the energy gap is decreased, namely the content of In is increased.

The selective growth process as mentioned above makes it possible to form regions in a substrate, which regions have different two-dimensional energy gaps. Hence, the selective growth technique is applied to various optical or electronic devices.

The energy gap change of the selective growth layer is due to an increase of the probability with which a particular atom contributes to growth of a selective growth region. For widening the applications of the selective growth process, it is required to two-dimensionally induce a larger composition change or a larger energy gap change. However, an increase in the number of particular atoms causes a large lattice mismatching to the substrate, and hence it is impossible to form a monocrystal epitaxial layer having good quality. Thus, the prior technique cannot practically provide a large energy gap change.

In addition, the prior technique deals only with energy gap change. However, if it would be possible to two-dimensionally control material properties such as optical anisotropy and electrical conductivity in a substrate, the selective growth technique could be utilized in wider field such as an optical integrated circuit.

SUMMARY OF THE INVENTION

In view of the foregoing problems of prior methods, it is an object of the present invention to provide a method for growing semiconductor crystals to induce a large energy gap change in selective growth regions in a controlled fashion.

Another object of the present invention is to provide a method for growing semiconductor crystals, which method is capable of two-dimensionally controlling material properties such as optical anisotropy and electrical conductivity in a substrate.

The invention provides a method for selective growth of semiconductor crystals including the step of forming a semiconductor layer in a selected region of a semiconductor substrate by using a mask, the semiconductor layer being controlled with respect to atomic ordering or natural super lattice (NSL).

In a preferred embodiment, the semiconductor is a chemical compound semiconductor including groups III–V species.

In another preferred embodiment, the group III atoms comprise two or more species of atoms.

In still preferred embodiment, the natural super lattice (NSL) is controlled with growth conditions of the semiconductor layer.

In yet another preferred embodiment, the growth conditions include a growth temperature.

In still yet another preferred embodiment, the growth conditions include a V/III ratio.

In further preferred embodiment, the III group atoms include at least one of In, Ga and Al.

In further preferred embodiment, the method is carried out with one of processes including MOVPE, MBE, gas source MBE and VPE.

The advantages obtained by the aforementioned present invention will be described hereinbelow.

FIGS. 2 and 2A show a method for selective growth of semiconductor crystals in accordance with the invention. On a semiconductor substrate 1 is formed a mask 2 composed of a striped pattern composed of $SiO_2$ or SiNx. Then, a semiconductor layer is selectively formed in non-patterned regions by means of a selective growth process such as MOVPE, MBE and VPE. The invention is characterized by controlling natural super lattice (NSL) at the level of atoms in accordance with growth conditions of a semiconductor layer.

The probability of arrival to a selective growth region of atoms which is to contribute to selective growth, and the probability with which such atoms are present in a selective growth region vary in accordance with a difference of a degree of removal and adsorption of such atoms in a substrate surface, and also with a difference of migration of such atoms. In addition, it is known that atoms are deposited having a certain degree of order in a particular face azimuth direction in a certain growth condition of semiconductor crystals. This phenomenon is called natural super lattice (NSL). The natural super lattice affects material properties such as energy gap, optical anisotropy and electrically conductive anisotropy, and a degree of order determines a degree of change of material properties. The natural super lattice can be formed by optimizing growth conditions such as a growth temperature and a V/III ratio. In the formation of the natural super lattice (NSL), important factors are selective incorporation of particular atoms at a step edge of a substrate and an arrangement of group V species on a surface, which arrangement is dependent on a V/III ratio or a pressure of group V species.

The invention makes it possible to control the order degree of atoms by forming natural super lattice (NSL) semiconductor layer on selective growth regions. A first reason why such a control is possible by the invention is as follows. In accordance with a principle of selective growth, a probability of arrival of atoms contributing to growth to a selective growth region and a probability with which such atoms are present in a selective growth region vary in dependence on a size of a selective growth region. Thus, selective incorporation of particular atoms at a step edge in the formation of natural super lattice (NSL) varies. A second reason is as follows. The invention makes it possible to intentionally control an arrangement of group V species on a surface of a selective growth region by varying a pressure of group V species or an effective V/III ratio in a minute region in accordance with a shape of a selective growth region. A factor which controls an order degree of atoms is a width of a selective growth region Wg equal to a width of an opening of a mask, or a width of a mask Wm.

Thus, the method in accordance with the invention controls an order degree of natural super lattice (NSL) to thereby control material properties in a selective growth layer such as energy gap, optical anisotropy and electrically conductive anisotropy. In addition, it is also possible by the invention to carry out two-dimensional control in a substrate in accordance with a shape of a mask pattern, and hence the method in accordance with the invention can be applied to other fields such as an optical integrated circuit.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 1A and 1 are respectively a schematic view for showing selective growth technique in accordance with prior art, and a graph showing a relationship between energy gap and a width of a selective growth region in an InGaAs selective growth layer.

FIGS. 3 and 3A are respectively a graph for showing a relationship between energy gap and a width of a selective growth region in an InGaAs selective growth layer formed in accordance with the invention in comparison with a similar relationship in an InGaAs selective growth layer formed by prior art.

DESCRIPTION OF THE PREFERRED EMBODIMENTS

A preferred embodiment in accordance with the present invention will be explained hereinbelow with reference to drawings.

Figure 2:
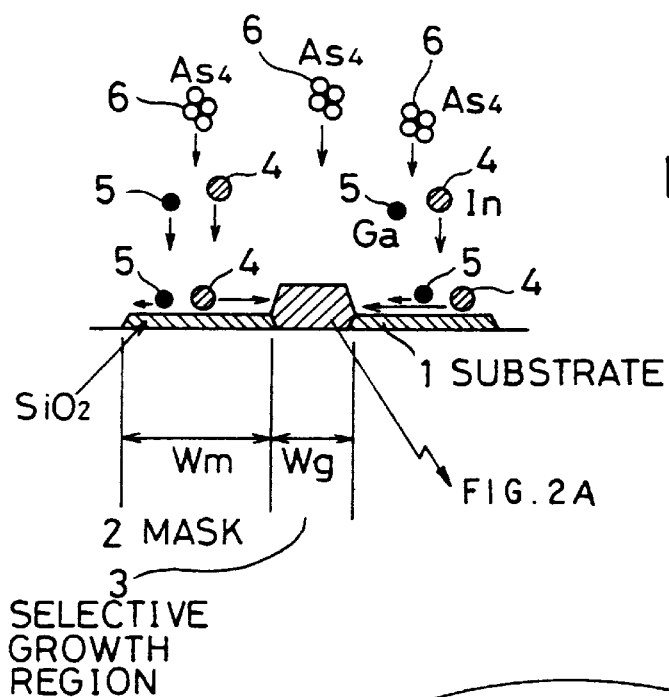
FIGS. 2 and 2A are respectively a schematic view of showing a basic principle of the invention and an embodiment in accordance with the invention.

FIG. 2 shows a process of selective growth of MOVPE growth InGaAs semiconductor layer formed in accordance with the invention. In MOVPE growth, group III atoms, In and Ga, are provided by an organic metal such as TMIn.TEGa, and group V species, As, are provided by $AsH_3$ gas. These atoms-sources TMIn.TEGa and $AsH_3$ are thermally decomposed in a reactive tube, and hence In atoms 4, Ga atoms 5 and $As_4$ molecules 6 reach a surface of a substrate 1. The In atoms 4 have a longer diffusion length than that of the Ga atoms 5, and hence the In atoms 4 have a higher probability for arriving at selective growth region 3. Hence, a probability with which the In atoms 4 are present in the selective growth region 3 is increased. This facilitates selective incorporation of the In atoms 4 at a step edge on the substrate 1, and hence the formation of natural super lattice is made easier.

In addition, it is possible to effectively change $As_4$ pressure in the selective growth region 3 induced due to the thermal decomposition of $AsH_3$, in accordance with a shape of a pattern defined with a width Wg of the selective growth region 3 and a width Wm of a mask 2. Thus, it is possible to intentionally control an arrangement of As species on a surface of the substrate 1 to thereby vary an order degree of natural super lattice (NSL).

Figure 2A:
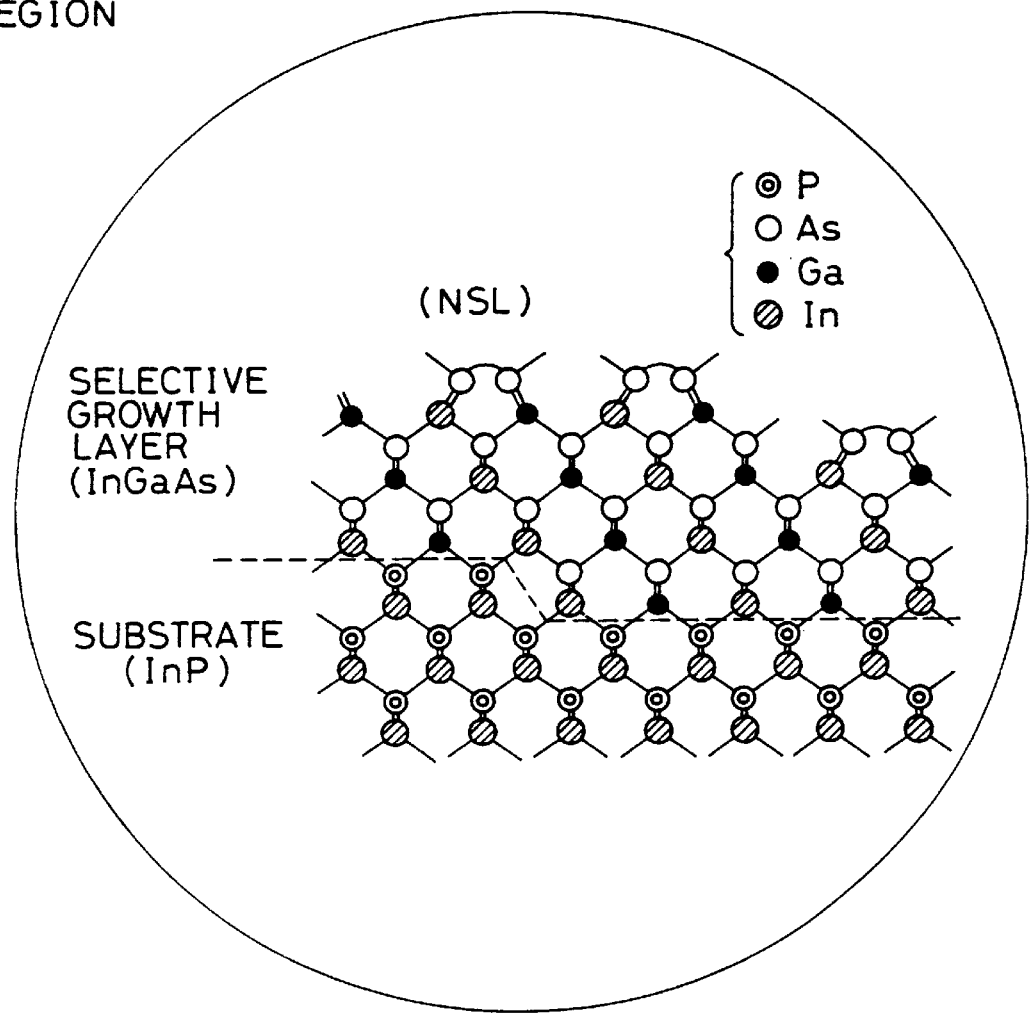

Due to the above mentioned two functions, a selective growth layer forms natural super lattice in which the In and Ga atoms 4, 5 are orderly arranged in a particular crystal orientation as illustrated in FIG. 2A. It is known that the natural super lattice (NSL) in an InGaAs layer works to reduce the energy gap. In addition, an increase of content of In atoms also reduces the energy gap. Thus, there can be obtained a great reduction of the energy gap.

FIGS. 3 and 3A show a dependency on a width of a selective growth region or a width of an opening of a mask, of the energy gap of an InGaAs selective growth layer formed in accordance with the invention, and also shows the corresponding dependency in the prior art. As is obvious from FIG. 3, the InGaAs layer formed in accordance with the invention produces a larger energy gap change than the prior art due to effects of the natural super lattice. It should be noted that the embodiment is directed only to energy gap change, but a similar dependency on a width of a selective growth region can be found with respect to other material properties such as optical anisotropy and electrically conductive anisotropy.

The embodiment is carried out with MOVPE, but the invention is not to be limited to MOVPE. The method in accordance with the invention may be carried out with MBE, gas source MBE or VPE.

While the present invention has been described in connection with certain preferred embodiment, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method for forming a semiconductor by growing a natural super lattice semiconductor layer including In and a group V species on a semiconductor substrate, said method comprising the steps of:

forming a mask pattern having an opening at a step edge of said semiconductor substrate for selective growth of said natural super lattice semiconductor layer;

selectively incorporating In atoms in said step edge of said semiconductor substrate to form said natural super lattice; and growing said semiconductor layer in said opening in said mask pattern, wherein an order degree of said natural super lattice of said semiconductor layer is controlled by a width of said opening in said mask pattern.

2. The method as recited in claim 1, wherein said semiconductor is a chemical compound semiconductor including groups III and V species.

3. The method as recited in claim 2, wherein said group III atoms comprise two or more species of atoms.

4. The method as recited in claim 1, wherein said order degree of said natural super lattice (NSL) is further controlled by a ratio of group V to group III source material at said opening of said semiconductor substrate, said ratio controlled in turn by said width of said opening combined with growth conditions.

5. The method as recited in claim 4, wherein said growth conditions include growth temperature.

6. The method as recited in claim 4, wherein said growth conditions include controlling a V/III ratio.

7. The method as recited in claim 2, wherein said III group atoms include at least one of In, Ga and Al.

8. The method as recited in claim 1, wherein said method is carried out with MOVPE.

9. The method as recited in claim 1, wherein said method is carried out with MBE.

10. The method as recited in claim 1, wherein said method is carried out with gas source MBE.

11. The method as recited in claim 1, wherein said method is carried out with VPE.

* * * * *